(12) United States Patent
Sugimura et al.

(10) Patent No.: US 10,886,072 B2
(45) Date of Patent: Jan. 5, 2021

(54) METHOD FOR PRODUCING PHOTOELECTRIC CONVERSION ELEMENT

(71) Applicant: SHARP KABUSHIKI KAISHA, Sakai (JP)

(72) Inventors: Hiroshi Sugimura, Sakai (JP); Shintaro Miyanishi, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 56 days.

(21) Appl. No.: 16/406,651

(22) Filed: May 8, 2019

(65) Prior Publication Data

US 2019/0348226 A1 Nov. 14, 2019

(30) Foreign Application Priority Data

May 9, 2018 (JP) .................................. 2018-090671

(51) Int. Cl.
| | | |
|---|---|---|
| *H01G 9/20* | (2006.01) | |
| *H01G 9/00* | (2006.01) | |
| *H01L 51/00* | (2006.01) | |
| *H01L 51/42* | (2006.01) | |
| *H01L 51/44* | (2006.01) | |

(52) U.S. Cl.
CPC ......... *H01G 9/2009* (2013.01); *H01G 9/0036* (2013.01); *H01G 9/2018* (2013.01); *H01L 51/0024* (2013.01); *H01L 51/0059* (2013.01); *H01L 51/0077* (2013.01); *H01L 51/4253* (2013.01); *H01L 51/442* (2013.01)

(58) Field of Classification Search
CPC combination set(s) only.
See application file for complete search history.

(56) References Cited

U.S. PATENT DOCUMENTS

| | | | | |
|---|---|---|---|---|
| 2013/0056074 | A1* | 3/2013 | Isobe ................. | H01L 51/0037 136/263 |
| 2016/0365525 | A1* | 12/2016 | Sugimura ............ | H01L 51/005 |
| 2018/0315939 | A1* | 11/2018 | Jung ................... | H01L 51/0028 |

FOREIGN PATENT DOCUMENTS

| | | |
|---|---|---|
| JP | 2008-159334 A | 7/2008 |
| JP | 2016-027587 A | 2/2016 |

* cited by examiner

*Primary Examiner* — Ratisha Mehta
(74) *Attorney, Agent, or Firm* — ScienBiziP, P.C.

(57) ABSTRACT

A method for producing a photoelectric conversion element includes forming a hole transport layer containing a hole transport material by causing the hole transport material to adhere to one of a light-absorbing layer and a conductive layer; melting the hole transport layer by heating the hole transport layer to a temperature that is higher than or equal to a melting point of the hole transport material and is in a range of 120° C. or higher and 170° C. or lower; and bonding the light-absorbing layer and the conductive layer with the hole transport layer disposed therebetween by performing cooling while bringing the other of the light-absorbing layer and the conductive layer into contact with the melted hole transport layer under pressure. The light-absorbing layer contains a compound represented by general formula (1), where A represents an organic molecule, B represents a metal atom, and X represents a halogen atom.

$$ABX_3 \qquad (1)$$

9 Claims, 4 Drawing Sheets

US 10,886,072 B2

METHOD FOR PRODUCING PHOTOELECTRIC CONVERSION ELEMENT

BACKGROUND

1. Field

The present disclosure relates to a method for producing a photoelectric conversion element.

2. Description of the Related Art

Photoelectric conversion elements are used for, for example, optical sensors, copiers, and solar cells. In particular, use of photoelectric conversion elements for solar cells is studied in terms of renewable energy. Examples of widespread solar cells include inorganic solar cells such as silicon solar cells, CIGS solar cells, and CdTe solar cells. Solar cells that use an organic-inorganic hybrid material as a photoelectric conversion material are also under study. Known examples of the method for producing a photoelectric conversion element used for such a solar cell include vapor deposition treatment and sealing treatment.

Japanese Unexamined Patent Application Publication No. 2016-27587 discloses that a photoelectric conversion element is produced through vapor deposition treatment. Specifically, it is disclosed in Examples of Japanese Unexamined Patent Application Publication No. 2016-27587 that gold is deposited on a hole transport layer by vapor deposition to produce a second electrode.

Japanese Unexamined Patent Application Publication No. 2008-159334 discloses that a photoelectric conversion element is produced through sealing treatment. Specifically, it is disclosed in Examples of Japanese Unexamined Patent Application Publication No. 2008-159334 that a photoelectric conversion layer and a positive electrode are disposed so as to face each other and a sealing portion is formed so as to surround the photoelectric conversion layer, and a molten material for hole transport layers is injected inside the sealing portion through an inlet.

SUMMARY

However, the vapor deposition treatment disclosed in Japanese Unexamined Patent Application Publication No. 2016-27587 demands a facility in which the vapor deposition treatment is performed in a vacuum. In the sealing treatment disclosed in Japanese Unexamined Patent Application Publication No. 2008-159334, the sealing portion needs to be disposed on the photoelectric conversion element, which complicates the structure and production process of the photoelectric conversion element.

In view of the foregoing, it is desirable to provide a simple method for producing a photoelectric conversion element having a high photoelectric conversion efficiency.

A method for producing a photoelectric conversion element according to an aspect of the present disclosure includes forming a hole transport layer containing a hole transport material by causing the hole transport material to adhere to one of a light-absorbing layer and a conductive layer; melting the hole transport layer by heating the hole transport layer to a temperature that is higher than or equal to a melting point of the hole transport material and is in a range of 120° C. or higher and 170° C. or lower; and bonding the light-absorbing layer and the conductive layer with the hole transport layer disposed therebetween by performing cooling while bringing the other of the light-absorbing layer and the conductive layer into contact with the melted hole transport layer under pressure. The light-absorbing layer contains a compound represented by general formula (1).

$$ABX_3 \tag{1}$$

In the general formula (1), A represents an organic molecule, B represents a metal atom, and X represents a halogen atom.

DESCRIPTION OF THE EMBODIMENTS

Figure 1:
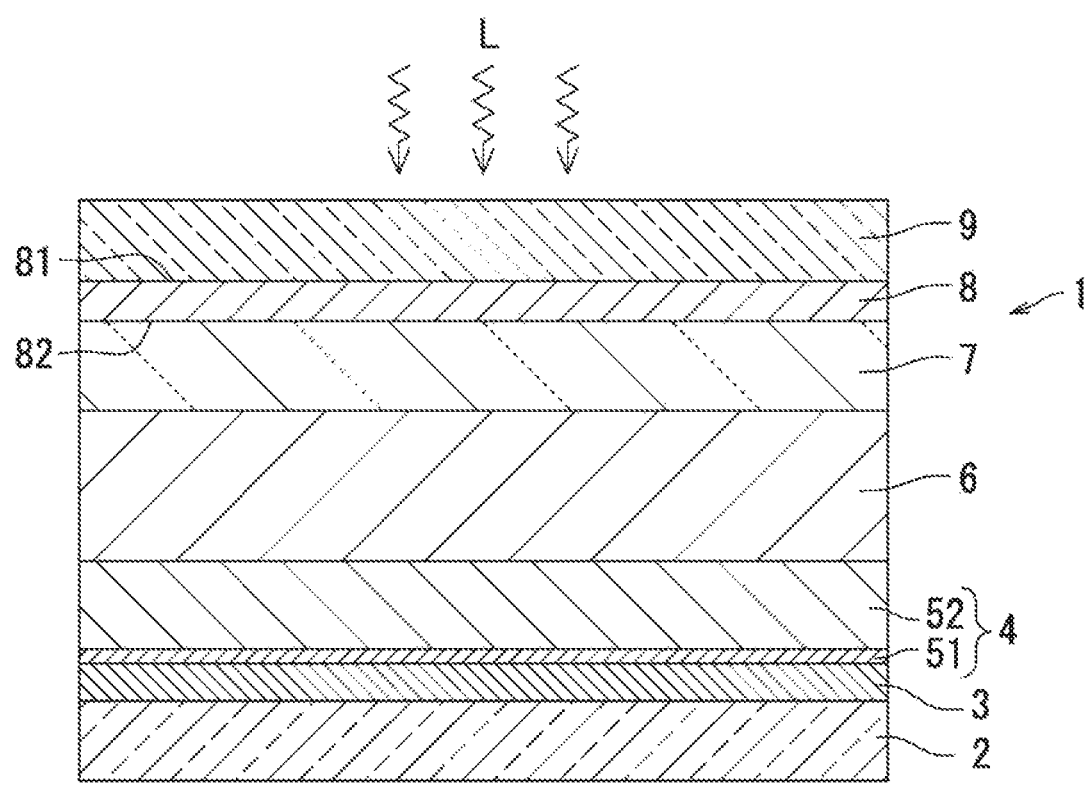
FIG. 1 is a sectional view illustrating a photoelectric conversion element produced by a production method according to an embodiment of the present disclosure.

Hereafter, an embodiment of the present disclosure will be described with reference to the attached drawings. In the drawings, the same or corresponding parts are designated by the same reference numerals, and the description thereof is omitted. The present disclosure is not limited by the embodiment, and any modifications can be appropriately made within the scope of the present disclosure. Hereafter, "acrylic" and "methacrylic" may be collectively referred to as "(meth)acrylic", and "acrylate" and "methacrylate" may be collectively referred to as "(meth)acrylate".

Method for Producing Photoelectric Conversion Element

This embodiment relates to a method for producing a photoelectric conversion element 1. First, the overview of a photoelectric conversion element 1 produced by a production method according to this embodiment will be described with reference to FIG. 1. The photoelectric conversion element 1 includes a first conductive layer 3, an electron transport layer 4, a light-absorbing layer 6, a hole transport layer 7, and a second conductive layer 8. The electron transport layer 4 includes a dense titanium oxide layer 51 and a porous titanium oxide layer 52. The photoelectric conversion element 1 may further optionally include a base 2 and a surface layer 9. When the photoelectric conversion element 1 includes the base 2, the first conductive layer 3 is disposed on the base 2. When the base 2 has a cylindrical shape, the first conductive layer 3 is disposed on a peripheral surface of the base 2. The electron transport layer 4 is disposed on the first conductive layer 3. The light-absorbing layer 6 is disposed on the electron transport layer 4. Specifically, the dense titanium oxide layer 51 of the electron transport layer 4 is disposed on the first conductive layer 3. The porous titanium oxide layer 52 of the electron transport layer 4 is disposed on the dense titanium oxide layer 51. The light-absorbing layer 6 is disposed on the porous titanium oxide layer 52. The hole transport layer 7 is disposed on the light-absorbing layer 6. The second conductive layer 8 is disposed on the hole transport layer 7. When the photoelectric conversion element 1 includes the surface layer 9, the surface layer 9 is disposed on the second conductive layer 8. Specifically, the surface layer 9 is disposed on a first surface 81 of the second conductive layer 8. The first surface 81 is a surface opposite to a second surface 82 of the second conductive layer 8. The second surface 82 is a surface that bonds to the hole transport layer 7. Light L (e.g., sunlight) is incident from the surface layer 9 of the photoelectric conversion element 1. To simplify the description, FIG. 1 illustrates the case where light L is incident from the surface layer 9 of the photoelectric conversion element 1. However, light L may be incident from the base 2 of the photoelectric conversion element 1 instead of from the surface layer 9.

Next, a method for producing a photoelectric conversion element 1 according to this embodiment will be described. The method for producing a photoelectric conversion element 1 according to this embodiment includes a step of forming a hole transport layer 7, a step of melting the hole transport layer 7, and a bonding step. In the step of forming a hole transport layer 7, a hole transport material is caused to adhere to one of the light-absorbing layer 6 and the conductive layer to form a hole transport layer 7 containing the hole transport material. The conductive layer to which the hole transport material is caused to adhere corresponds to the second conductive layer 8. In the step of melting the hole transport layer 7, the hole transport layer 7 is heated to a temperature that is higher than or equal to the melting point of the hole transport material and is in the range of 120° C. or higher and 170° C. or lower to melt the hole transport layer 7. In the bonding step, cooling is performed while the other of the light-absorbing layer 6 and the second conductive layer 8 is brought into contact with the melted hole transport layer 7 under pressure, thereby bonding the light-absorbing layer 6 and the second conductive layer 8 with the hole transport layer 7 disposed therebetween. The light-absorbing layer 6 contains a compound represented by general formula (1) described later. Hereafter, the "compound represented by the general formula (1)" may be simply referred to as a "compound (1)". The method for producing a photoelectric conversion element 1 according to this embodiment has the first to fifth advantages below.

The first advantage will be described. In the production method according to this embodiment, the light-absorbing layer 6 and the second conductive layer 8 are bonded to each other with the melted hole transport layer 7 disposed therebetween. Therefore, the second conductive layer can be formed on the hole transport layer by a method other than vapor deposition, which does not demand vacuum deposition equipment used to form the second conductive layer. Thus, in the production method according to this embodiment, a photoelectric conversion element 1 having a high photoelectric conversion efficiency can be produced by a simple method.

The second advantage will be described. In the production method according to this embodiment, cooling is performed while the other of the light-absorbing layer 6 and the second conductive layer 8 is brought into contact with the melted hole transport layer 7 under pressure, thereby bonding the light-absorbing layer 6 and the second conductive layer 8 with the hole transport layer 7 disposed therebetween. Therefore, the light-absorbing layer 6 and the second conductive layer 8 can be bonded to each other without forming a sealing portion that surrounds the peripheries of the light-absorbing layer and the second conductive layer and injecting a molten hole transport material inside the sealing portion. Thus, in the production method according to this embodiment, a photoelectric conversion element 1 having a high photoelectric conversion efficiency can be produced by a simple method without complicating the structure and production process of the photoelectric conversion element 1.

The third advantage will be described. In the production method according to this embodiment, the hole transport layer 7 is heated to a temperature that is higher than or equal to the melting point of the hole transport material and is in the range of 120° C. or higher and 170° C. or lower to melt the hole transport layer 7. By melting, in the melting step, the hole transport layer 7 that has been formed in the formation step, the bonding strength of the hole transport layer 7 to the other of the light-absorbing layer 6 and the second conductive layer 8 can be increased.

The fourth advantage will be described. In the production method according to this embodiment, the hole transport layer 7 is heated to a temperature that is higher than or equal to the melting point of the hole transport material and is in the range of 120° C. or higher and 170° C. or lower to melt the hole transport layer 7. Since the heating temperature is higher than or equal to the melting point of the hole transport material and is in the range of 120° C. or higher and 170° C. or lower, the heating temperature is not excessively high. Therefore, the deterioration of components (more specifically, for example, the compound (1) contained in the light-absorbing layer 6) of the photoelectric conversion element 1 due to heating can be suppressed.

The fifth advantage will be described. In the production method according to this embodiment, a hole transport material is caused to adhere to one of the light-absorbing layer 6 and the conductive layer to form a hole transport layer 7 containing the hole transport material. By forming the hole transport layer 7 once in the formation step, a state in which the hole transport layer 7 contains substantially no solvent is provided. If the other of the light-absorbing layer 6 and the second conductive layer 8 is brought into contact with the hole transport layer 7 under pressure in a state in which a solvent is left in the hole transport layer 7, the solvent volatilizes, which generates air bubbles in the photoelectric conversion element 1. By forming the hole transport layer 7 once in the formation step, a photoelectric conversion element 1 can be suitably produced without generating air bubbles.

The method for producing a photoelectric conversion element 1 according to this embodiment can be selected from a first suitable method and a second suitable method. In the first suitable method, a hole transport material is caused to adhere to the second conductive layer 8, which is one selected from the light-absorbing layer 6 and the second conductive layer 8, in the step of forming a hole transport layer 7. In the second suitable method, a hole transport material is caused to adhere to the light-absorbing layer 6, which is one selected from the light-absorbing layer 6 and the second conductive layer 8, in the step of forming a hole transport layer 7.

Figure 2:
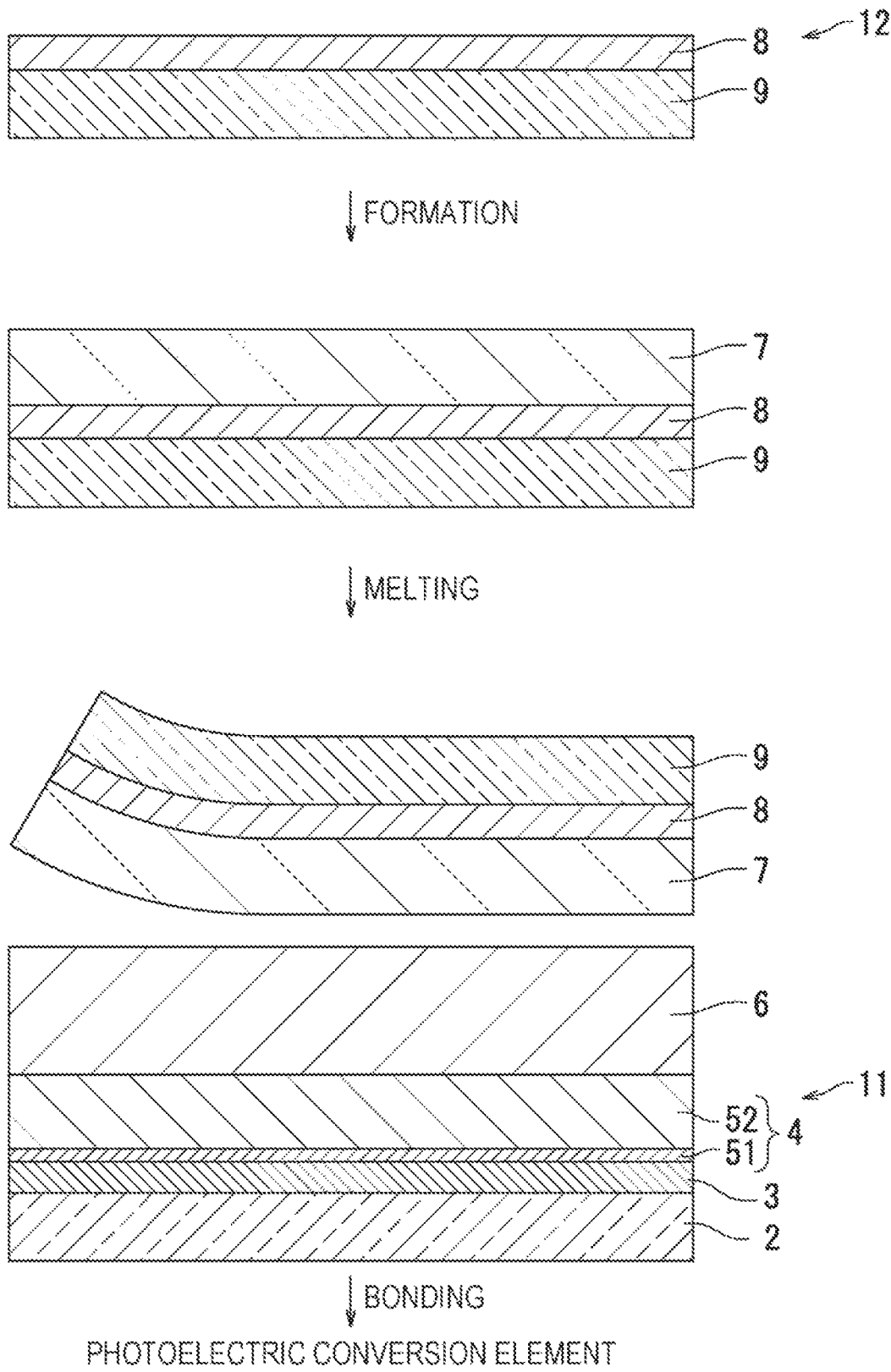
FIG. 2 illustrates one example of a method for producing a photoelectric conversion element according to an embodiment of the present disclosure.

Hereafter, the first suitable method will be described with reference to FIG. 2. First, a first multilayer body 11 and a second multilayer body 12 are prepared. The first multilayer body 11 includes a base 2, a first conductive layer 3, an electron transport layer 4, and a light-absorbing layer 6 in this order. The base 2 may be optionally omitted, and the first multilayer body 11 includes at least a first conductive layer 3, an electron transport layer 4, and a light-absorbing layer 6. The second multilayer body 12 includes a surface layer 9 and a second conductive layer 8 in this order. The surface layer 9 may be optionally omitted, and the second multilayer body 12 includes at least a second conductive layer 8. In the step of forming a hole transport layer 7, a hole transport material is caused to adhere to the second conductive layer 8 of the second multilayer body 12 to form a hole transport layer 7 containing the hole transport material. In the step of melting the hole transport layer 7, the hole transport layer 7 is heated to a temperature that is higher than or equal to the melting point of the hole transport material and is in the range of 120° C. or higher and 170° C. or lower to melt the hole transport layer 7. In the bonding step, cooling is performed while the light-absorbing layer 6 of the first multilayer body 11 is brought into contact with the melted hole transport layer 7 under pressure, thereby bonding the light-absorbing layer 6 and the second conductive layer 8 with the hole transport layer 7 disposed therebetween. Thus, a photoelectric conversion element 1 is produced.

Figure 3:
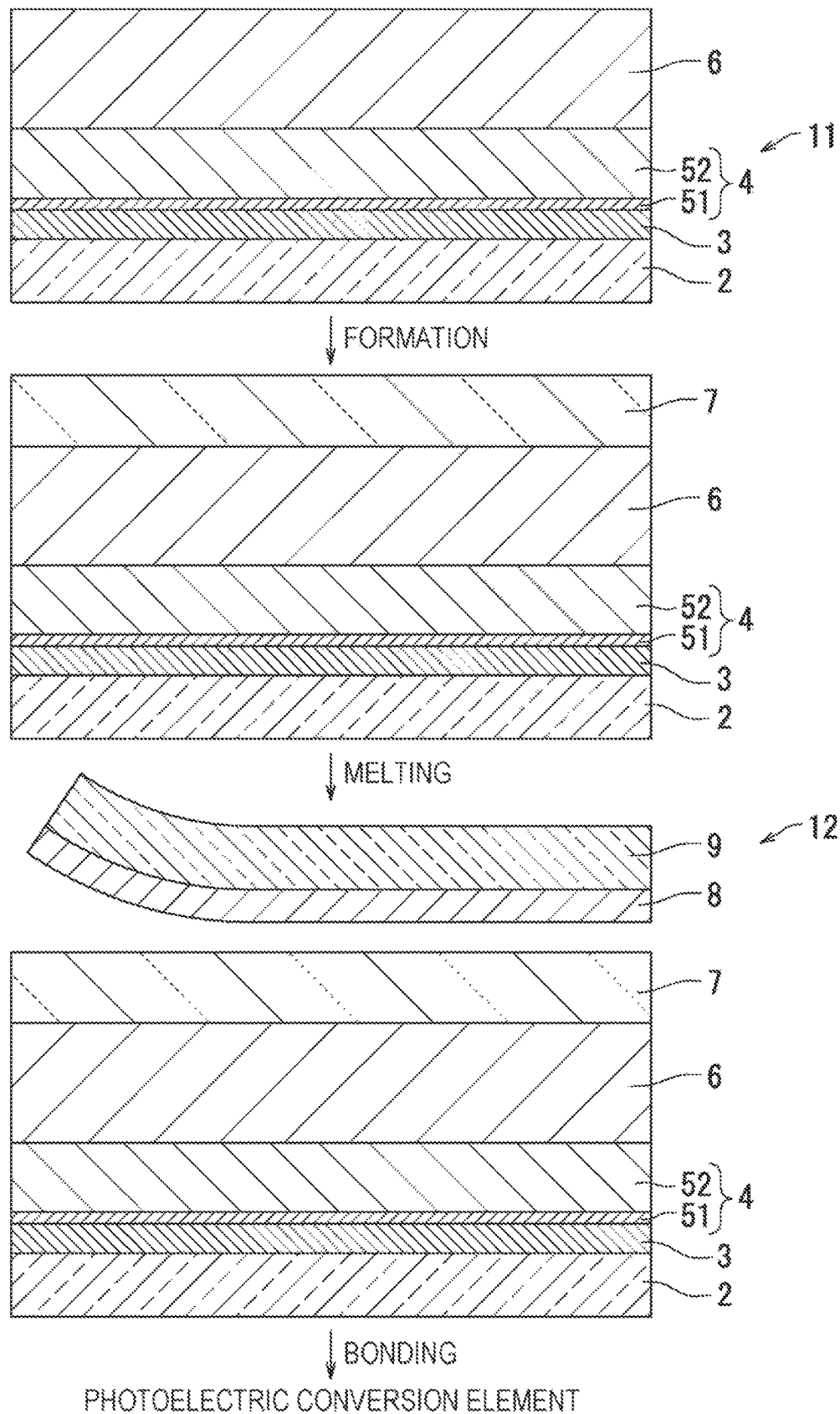
FIG. 3 illustrates another example of the method for producing a photoelectric conversion element according to an embodiment of the present disclosure.

Hereafter, the second suitable method will be described with reference to FIG. 3. First, a first multilayer body 11 and a second multilayer body 12 are prepared. In the step of forming a hole transport layer 7, a hole transport material is caused to adhere to the light-absorbing layer 6 of the first multilayer body 11 to form a hole transport layer 7 containing the hole transport material. In the step of melting the hole transport layer 7, the hole transport layer 7 is heated to a temperature that is higher than or equal to the melting point of the hole transport material and is in the range of 120° C. or higher and 170° C. or lower to melt the hole transport layer 7. In the bonding step, cooling is performed while the second conductive layer 8 of the second multilayer body 12 is brought into contact with the melted hole transport layer 7 under pressure, thereby bonding the light-absorbing layer 6 and the second conductive layer 8 with the hole transport layer 7 disposed therebetween. Thus, a photoelectric conversion element 1 is produced.

As described above, the method for producing a photoelectric conversion element 1 according to this embodiment includes a step of forming a hole transport layer 7, a step of melting the hole transport layer 7, and a bonding step. The method for producing a photoelectric conversion element 1 according to this embodiment may further optionally include a step of preparing a first conductive layer 3, a step of forming an electron transport layer, a step of forming a light-absorbing layer, and a step of preparing a second conductive layer 8. The first multilayer body 11 is formed through the step of preparing a first conductive layer 3, the step of forming an electron transport layer, and the step of forming a light-absorbing layer. The second multilayer body 12 is formed through the step of preparing a second conductive layer 8. Hereafter, each of the steps will be described.

Step of Preparing First Conductive Layer

In the step of preparing a first conductive layer 3, a first conductive layer 3 is formed on a base 2. When the base 2 is formed of an insulating material, the first conductive layer 3 is formed on the base 2 by a method such as a vacuum deposition method, a sputtering method, or a plating method. When the base 2 is formed of a conductive material, the base 2 also serves as a first conductive layer 3, and thus the step of preparing a first conductive layer 3 can be omitted. In this case, the base 2 can be used as a first conductive layer 3 that also serves as the base 2. When a commercially available product is used as a base 2 including a first conductive layer 3, the step of preparing a first conductive layer 3 can be omitted.

Step of Forming Electron Transport Layer

In the step of forming an electron transport layer, an electron transport layer 4 is formed on the first conductive layer 3. The step of forming an electron transport layer includes a step of forming a dense titanium oxide layer and a step of forming a porous titanium oxide layer.

In the step of forming a dense titanium oxide layer, a dense titanium oxide layer 51 is formed on the first conductive layer 3. For example, a dense titanium oxide layer-forming coating liquid containing a titanium chelate compound is applied onto the first conductive layer 3 and fired to form a dense titanium oxide layer 51. The dense titanium oxide layer-forming coating liquid is applied onto the first conductive layer 3 by a method such as a spin coating method, a screen printing method, a casting method, a dip coating method, a roll coating method, a slot die coating method, a spray pyrolysis method, or an aerosol deposition method. The dense titanium oxide layer 51 may be immersed in an aqueous titanium tetrachloride solution after firing. This can increase the density of the dense titanium oxide layer 51.

In the step of forming a porous titanium oxide layer, a porous titanium oxide layer 52 is formed on the dense titanium oxide layer 51. For example, a porous titanium oxide layer-forming coating liquid containing a titanium chelate compound can be applied onto the dense titanium oxide layer 51 and fired to form a porous titanium oxide layer 52. When the porous titanium oxide layer-forming coating liquid contains an organic binder, the organic binder can be removed through firing. The porous titanium oxide layer-forming coating liquid is applied onto the dense titanium oxide layer 51 by a method such as a spin coating method, a screen printing method, a casting method, a dip coating method, a roll coating method, a slot die coating method, a spray pyrolysis method, or an aerosol deposition method.

The pore diameter and porosity of the porous titanium oxide layer 52 can be adjusted by, for example, changing the particle size of titanium oxide particles and changing the type of organic binder and the amount of organic binder added.

When the porous titanium oxide layer-forming coating liquid contains an organic binder, the organic binder may be ethyl cellulose or acrylic resin. The acrylic resin has good degradability at low temperature. Thus, even if firing is performed at low temperature, organic substances are not easily left in the porous titanium oxide layer 52. The acrylic resin may be degraded at a temperature of about 300° C. Specifically, the acrylic resin is a polymer constituted by at least one (meth)acrylic monomer. Examples of the (meth) acrylic monomer that can be used for polymerization of the acrylic resin include methyl (meth)acrylate, ethyl (meth) acrylate, propyl (meth)acrylate, n-butyl (meth)acrylate, tert-butyl (meth)acrylate, isobutyl (meth)acrylate, cyclohexyl (meth)acrylate, 2-ethylhexyl (meth)acrylate, isobornyl (meth)acrylate, n-stearyl (meth)acrylate, benzyl (meth)acrylate, and (meth)acrylic monomers having a polyoxyalkylene structure.

Step of Forming Light-Absorbing Layer

In the step of forming a light-absorbing layer, a light-absorbing layer 6 is formed on the electron transport layer 4. Specifically, a light-absorbing layer 6 is formed on the porous titanium oxide layer 52 of the electron transport layer 4. The light-absorbing layer 6 contains the compound (1). The light-absorbing layer 6 can be formed by a method such as a single-stage method or a two-stage method.

In the single-stage method, a solution containing a compound represented by formula "AX" (hereafter referred to as a compound (AX)) and a solution containing a compound represented by formula "BX$_2$" (hereafter referred to as a compound (BX$_2$)) are mixed with each other to obtain a mixed solution. A, B, and X in the formula "AX" and the formula "BX$_2$" are the same as A, B, and X in the general formula (1), respectively. The mixed solution is applied onto the porous titanium oxide layer 52 and dried to form a light-absorbing layer 6 containing the compound (1) represented by the general formula "$ABX_3$". The mixed solution can be applied onto the porous titanium oxide layer 52 by a method such as a spin coating method, a screen printing method, or a dip coating method.

In the two-stage method, a solution containing a compound ($BX_2$) is applied onto the porous titanium oxide layer 52 to form a coating film. A solution containing a compound (AX) is applied onto the coating film to cause a reaction of the compound ($BX_2$) and the compound (AX) in the coating film. Then, the coating film is dried to form a light-absorbing layer 6 containing the compound (1) represented by the general formula "$ABX_3$". The method for applying the solution containing a compound ($BX_2$) onto the porous titanium oxide layer 52 and the method for applying the solution containing a compound (AX) onto the coating film are performed by, for example, a spin coating method, a screen printing method, or a dip coating method. A first multilayer body 11 including the light-absorbing layer 6 is formed through the step of forming a light-absorbing layer.

Step of Preparing Second Conductive Layer

In the step of preparing a second conductive layer 8, a second conductive layer 8 is formed on a surface layer 9. When a commercially available product is used as the second conductive layer 8 including the surface layer 9, the step of preparing a second conductive layer 8 can be omitted. A second multilayer body 12 including the second conductive layer 8 is formed through the step of preparing a second conductive layer 8.

Step of Forming Hole Transport Layer

In the step of forming a hole transport layer 7, a hole transport material is caused to adhere to one of the light-absorbing layer 6 and the second conductive layer 8 to form a hole transport layer 7 containing the hole transport material.

One specific example of the step of forming a hole transport layer will be described. A powdery hole transport material is scattered on one of the light-absorbing layer 6 and the second conductive layer 8. Then, the hole transport material is heated to the melting point of the hole transport material to form a hole transport layer 7. By scattering the powdery hole transport material, a hole transport layer 7 that does not contain a solvent can be formed. This can suppress the generation of air bubbles due to volatilization of a solvent. When the heating temperature of the hole transport material is set to a temperature that is higher than or equal to the melting point of the hole transport material and is in the range of 120° C. or higher and 170° C. or lower, the step of forming a hole transport layer 7 and the step of melting the hole transport layer 7 described later can be performed at the same time.

Another specific example of the step of forming a hole transport layer will be described. A hole transport layer-forming coating liquid containing a hole transport material and a solvent is prepared. The hole transport layer-forming coating liquid is applied onto one of the light-absorbing layer 6 and the second conductive layer 8 and dried to form a hole transport layer 7. To suppress the generation of air bubbles due to volatilization of the solvent, desirably, the formed hole transport layer 7 substantially does not contain a solvent. When the hole transport layer-forming coating liquid is applied onto the light-absorbing layer 6 and dried, the solvent contained in the hole transport layer-forming coating liquid may be a solvent that does not disturb the crystal structure of the compound (1). Examples of the solvent contained in the hole transport layer-forming coating liquid include chlorobenzene and toluene. The hole transport layer-forming coating liquid is applied by a method such as a dip coating method, a spray coating method, or a slide hopper coating method.

Step of Melting Hole Transport Layer

In the step of melting the hole transport layer 7, the hole transport layer 7 is heated to a temperature that is higher than or equal to the melting point of the hole transport material and is in the range of 120° C. or higher and 170° C. or lower to melt the hole transport layer 7. Examples of a heater for the hole transport layer 7 include ovens, heating dryers, and hot plates. The melting point of the hole transport material can be measured with, for example, a visual type melting point measuring instrument (e.g., "MP-21" manufactured by Yamato Scientific Co., Ltd.).

Bonding Step

In the bonding step, cooling is performed while the other of the light-absorbing layer 6 and the second conductive layer 8 is brought into contact with the melted hole transport layer 7 under pressure, thereby bonding the light-absorbing layer 6 and the second conductive layer 8 with the hole transport layer 7 disposed therebetween. When the first suitable method illustrated in FIG. 2 is employed, the second multilayer body 12 and the first multilayer body 11 are laid on top of each other so that the hole transport layer 7 formed on the second multilayer body 12 and the light-absorbing layer 6 of the first multilayer body 11 face each other. The second multilayer body 12 and the first multilayer body 11 laid on top of each other with the hole transport layer 7 disposed therebetween are gradually cooled while being in contact with each other under pressure. When the second suitable method illustrated in FIG. 3 is employed, the second multilayer body 12 and the first multilayer body 11 are laid on top of each other so that the hole transport layer 7 formed on the first multilayer body 11 and the second conductive layer 8 of the second multilayer body 12 face each other. The second multilayer body 12 and the first multilayer body 11 laid on top of each other with the hole transport layer 7 disposed therebetween are gradually cooled while being in contact with each other under pressure.

Before the other of the light-absorbing layer 6 and the second conductive layer 8 is brought into contact with the hole transport layer 7 under pressure, the other of the light-absorbing layer 6 and the second conductive layer 8 may be heated to a temperature that is higher than or equal to the melting point of the hole transport material and is in the range of 120° C. or higher and 170° C. or lower. By heating not only one of the light-absorbing layer 6 and the second conductive layer 8 but also the other before bonding, the hole transport layer 7 is not easily cooled when the hole transport layer 7 and the other are brought into contact with each other under pressure, and thus the melting state of the hole transport layer 7 can be maintained for a long time. Consequently, the light-absorbing layer 6 and the second conductive layer 8 can be more favorably bonded to each other with the hole transport layer 7 disposed therebetween. When the first suitable method illustrated in FIG. 2 is employed, not only the second multilayer body 12 on which the hole transport layer 7 has been formed, but also the first multilayer body 11 including the light-absorbing layer 6 may be heated before the light-absorbing layer 6 is brought into contact with the hole transport layer 7 under pressure. When the second suitable method illustrated in FIG. 3 is employed, not only the first multilayer body 11 on which the hole transport layer 7 has been formed, but also the second multilayer body 12 including the second conductive layer 8 may be heated before the second conductive layer 8 is brought into contact with the hole transport layer 7 under pressure.

The step of preparing a first conductive layer 3, the step of forming an electron transport layer, the step of forming a light-absorbing layer, the step of preparing a second conductive layer 8, the step of forming a hole transport layer 7, the step of melting the hole transport layer 7, and the bonding step can each be performed under normal pressure. In the step of forming a hole transport layer 7, the step of melting the hole transport layer 7, and the bonding step, the photoelectric conversion element 1 desirably does not include a sealing portion. However, to further reduce the influence of oxygen and humidity during the distribution and use of products, the periphery (side surface) of the light-absorbing layer 6 may be covered with a sealing portion after the photoelectric conversion element 1 is formed. Up to this point, the method for producing a photoelectric conversion element 1 according to this embodiment has been described.

Photoelectric Conversion Element

Next, the base 2, the first conductive layer 3, the electron transport layer 4, the dense titanium oxide layer 51, the porous titanium oxide layer 52, the light-absorbing layer 6, the hole transport layer 7, the second conductive layer 8, and the surface layer 9 included in the photoelectric conversion element 1 produced by the production method according to this embodiment will be described.

Base

The base 2 has, for example, a flat-plate shape, a film shape, or a cylindrical shape. Examples of the material for the base 2 include aluminum, nickel, chromium, magnesium, iron, tin, titanium, gold, silver, copper, tungsten, and alloys of the foregoing metals. An example of the alloy is stainless steel. Other examples of the material for the base 2 include transparent glass (more specifically, for example, soda-lime glass or alkali-free glass) and ceramic.

First Conductive Layer

The first conductive layer 3 corresponds to a cathode of the photoelectric conversion element 1. Examples of the material for the first conductive layer 3 include transparent conductive materials such as copper iodide (CuI), tin-doped indium oxide (ITO), tin oxide ($SnO_2$), fluorine-doped tin oxide (FTO), aluminum-doped zinc oxide (AZO), indium zinc oxide (IZO), and gallium-doped zinc oxide (GZO); sodium; sodium-potassium alloys; lithium; magnesium; aluminum; magnesium-silver mixtures; magnesium-indium mixtures; aluminum-lithium alloys; aluminum-aluminum oxide mixtures (Al/$Al_2O_3$); and aluminum-lithium fluoride mixtures (Al/LiF). The first conductive layer 3 may contain only one of the materials or two or more of the materials.

The thickness of the first conductive layer 3 is not particularly limited and may be 0.4 μm or more. When the first conductive layer 3 has a thickness of 0.4 μm or more, good conductivity can be imparted to the first conductive layer 3. When the base 2 is formed of a conductive material, the base 2 also serves as the first conductive layer 3, and therefore the dense titanium oxide layer 51 may be disposed on the first conductive layer 3 that also serves as the base 2.

Electron Transport Layer

The electron transport layer 4 is a layer that transports electrons generated through photoexcitation in the light-absorbing layer 6 to the first conductive layer 3. Therefore, the electron transport layer 4 is formed of a material capable of favorably moving electrons generated in the light-absorbing layer 6 to the first conductive layer 3. The electron transport layer 4 may be formed of titanium oxide. The electron transport layer 4 formed of titanium oxide includes a dense titanium oxide layer 51 and a porous titanium oxide layer 52. Hereafter, the dense titanium oxide layer 51 and the porous titanium oxide layer 52 will be described.

Electron Transport Layer: Dense Titanium Oxide Layer

The porosity of the dense titanium oxide layer 51 is lower than that of the porous titanium oxide layer 52. When the dense titanium oxide layer 51 is disposed, a light-absorbing material (photoelectric conversion material) contained in the light-absorbing layer 6 is not easily infiltrated into the dense titanium oxide layer 51. The presence of the dense titanium oxide layer 51 can also inhibit the contact between the first conductive layer 3 and the second conductive layer 8 that causes reduction in electromotive force. The thickness of the dense titanium oxide layer 51 is preferably 5 nm or more and 200 nm or less and more preferably 10 nm or more and 100 nm or less.

Examples of the titanium chelate compound that can be used to form the dense titanium oxide layer 51 include commercially available products such as "TYZOR (registered trademark) AA series" manufactured by Du Pont. Other examples of the titanium chelate compound that can be used to form the dense titanium oxide layer 51 include compounds having an acetoacetate chelate group and compounds having a β-diketone chelate group.

Non-limiting examples of the compounds having an acetoacetate chelate group include diisopropoxytitanium bis(methylacetoacetate), diisopropoxytitanium bis(ethylacetoacetate), diisopropoxytitanium bis(propylacetoacetate), diisopropoxytitanium bis(butylacetoacetate), dibutoxytitanium bis(methylacetoacetate), dibutoxytitanium bis(ethylacetoacetate), triisopropoxytitanium methylacetoacetate, triisopropoxytitanium ethylacetoacetate, tributoxytitanium methylacetoacetate, tributoxytitanium ethylacetoacetate, isopropoxytitanium tri(methylacetoacetate), isopropoxytitanium tri(ethylacetoacetate), isobutoxytitanium tri(methylacetoacetate), and isobutoxytitanium tri(ethylacetoacetate).

Non-limiting examples of the compounds having a β-diketone chelate group include diisopropoxytitanium bis(acetylacetonate), diisopropoxytitanium bis(2,4-heptanedionate), dibutoxytitanium bis(acetylacetonate), dibutoxytitanium bis(2,4-heptanedionate), triisopropoxytitanium acetylacetonate, triisopropoxytitanium 2,4-heptanedionate, tributoxytitanium acetylacetonate, tributoxytitanium 2,4-heptanedionate, isopropoxytitanium tri(acetylacetonate), isopropoxytitanium tri(2,4-heptanedionate), isobutoxytitanium tri(acetylacetonate), and isobutoxytitanium tri(2,4-heptanedionate).

Electron Transport Layer: Porous Titanium Oxide Layer

The porous titanium oxide layer 52 is a porous layer. The porosity of the porous titanium oxide layer 52 is higher than that of the dense titanium oxide layer 51. When the porous titanium oxide layer 52 is disposed, a light-absorbing material contained in the light-absorbing layer 6 is easily infiltrated into the pores of the porous titanium oxide layer 52. Furthermore, the light-absorbing layer 6 is formed in the pores, which can increase the contact area between the light-absorbing layer 6 and the porous titanium oxide layer 52. When the contact area is increased, electrons generated through photoexcitation in the light-absorbing layer 6 can be efficiently moved to the porous titanium oxide layer 52. Not only the light-absorbing layer 6 but also a part of the hole transport layer 7 may be formed in the pores of the porous titanium oxide layer 52. When a part of the hole transport layer 7 is formed in the pores of the porous titanium oxide layer 52, the contact area between the light-absorbing layer 6 and the hole transport layer 7 can be increased. Consequently, holes generated through photoexcitation in the light-absorbing layer 6 can be efficiently moved to the hole transport layer 7. The thickness of the porous titanium oxide layer 52 is preferably 100 nm or more and 20000 nm or less and more preferably 200 nm or more and 1500 nm or less.

A non-limiting example of the titanium oxide for the porous titanium oxide layer 52 is an anatase titanium oxide. One example of the porous titanium oxide layer-forming coating liquid used to form the porous titanium oxide layer 52 is a dispersion liquid prepared by dispersing titanium oxide particles (more specifically, for example, titanium oxide ("AEROXIDE (registered trademark) $TiO_2$ P25" manufactured by NIPPON AEROSIL Co., Ltd.)) in an alcohol (more specifically, for example, ethanol). Another example of the porous titanium oxide layer-forming coating liquid used to form the porous titanium oxide layer 52 is a liquid prepared by diluting a titanium oxide paste (more specifically, for example, "PST-18NR" manufactured by JGC Catalysts and Chemicals Ltd.) with an alcohol (more specifically, for example, ethanol).

The electron transport layer 4 may be formed of a material other than titanium oxide. For example, the electron transport layer 4 may include a dense layer formed of a material other than titanium oxide and a porous layer formed of a material other than titanium oxide. In this case, the porous layer formed of a material other than titanium oxide is disposed on the dense layer formed of a material other than titanium oxide.

Light-Absorbing Layer

The light-absorbing layer 6 is a layer that generates electrons and holes through absorption of light L incident from the surface layer 9 of the photoelectric conversion element 1. Low-energy electrons in the light-absorbing material contained in the light-absorbing layer 6 are photo-excited by incident light L, and thus high-energy electrons and holes are generated. The generated electrons move to the electron transport layer 4. The generated holes move to the hole transport layer 7. This movement of electrons and holes causes charge separation.

The light-absorbing layer 6 contains a compound (1) as a light-absorbing material. The compound (1) is represented by general formula (1) below.

$$ABX_3 \qquad (1)$$

In the general formula (1), A represents an organic molecule, B represents a metal atom, and X represents a halogen atom. The compound (1) used as a light-absorbing material is a crystal of an organic-inorganic hybrid compound. The organic-inorganic hybrid compound is a compound constituted by an inorganic material and an organic material. Since the photoelectric conversion element 1 includes the light-absorbing layer 6 containing the compound (1) that is such an organic-inorganic hybrid compound, the photoelectric conversion element 1 is also referred to as an organic-inorganic hybrid photoelectric conversion element. Unlike light-absorbing layers that are formed by vacuum deposition and contain a light-absorbing material which is an inorganic material, the light-absorbing layer 6 containing the compound (1) can be formed by performing coating. This can simplify the production process and reduce the production cost. Furthermore, when the light-absorbing layer 6 contains the compound (1), the photoelectric conversion efficiency can be improved.

Figure 4:
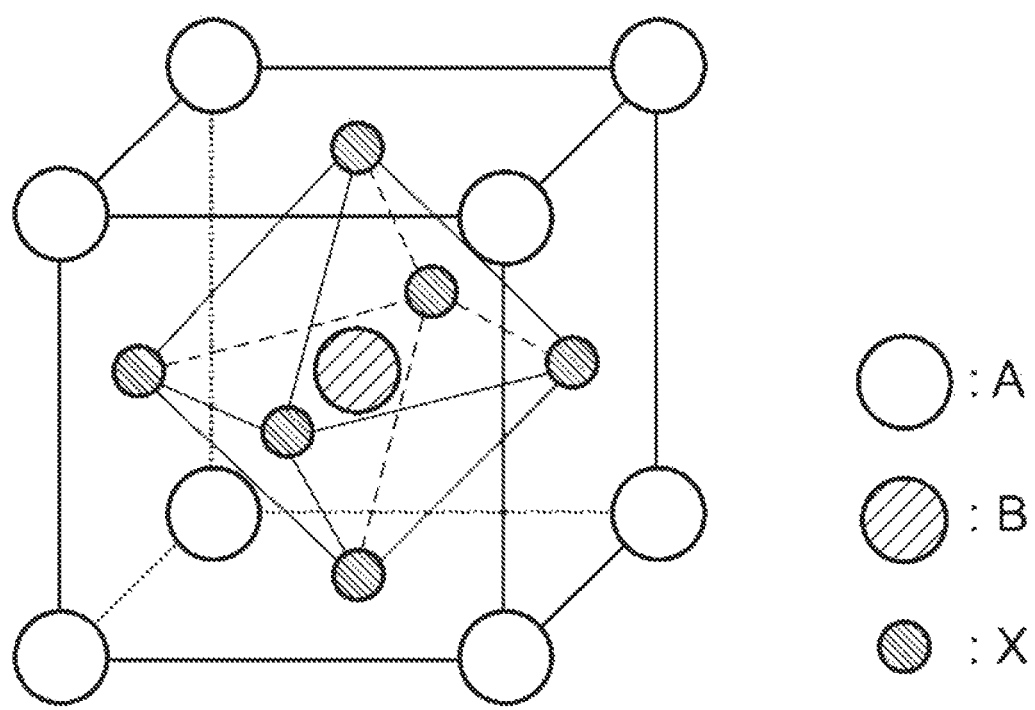
FIG. 4 illustrates a primitive unit cell of a perovskite crystal structure.

The compound (1) has, for example, a perovskite crystal structure. FIG. 4 illustrates a primitive unit cell of the perovskite crystal structure. As illustrated in FIG. 4, when the compound (1) has a perovskite crystal structure, the compound (1) has a cubic primitive unit cell. This primitive unit cell includes organic molecules A that occupy the vertexes of the cell, a metal atom B that occupies the body-centered position of the cell, and halogen atoms X that occupy the face-centered positions of the cell.

Examples of the organic molecule represented by A in the general formula (1) include alkylamines, alkylammoniums, and nitrogen-containing heterocyclic compounds. For the organic molecule represented by A in the general formula (1), only one organic molecule may be used or two or more organic molecules may be used.

Examples of the alkylamines include methylamine, ethylamine, propylamine, butylamine, pentylamine, hexylamine, dimethylamine, diethylamine, dipropylamine, dibutylamine, dipentylamine, dihexylamine, trimethylamine, triethylamine, tripropylamine, tributylamine, tripentylamine, trihexylamine, ethylmethylamine, methylpropylamine, butylmethylamine, methylpentylamine, hexylmethylamine, ethylpropylamine, and ethylbutylamine.

The alkylammonium is an ionized compound of the alkylamine. Examples of the alkylammonium include methylammonium ($CH_3NH_3$), ethylammonium, propylammonium, butylammonium, pentylammonium, hexylammonium, dimethylammonium, diethylammonium, dipropylammonium, dibutylammonium, dipentylammonium, dihexylammonium, trimethylammonium, triethylammonium, tripropylammonium, tributylammonium, tripentylammonium, trihexylammonium, ethylmethylammonium, methylpropylammonium, butylmethylammonium, methylpentylammonium, hexylmethylammonium, ethylpropylammonium, and ethylbutylammonium.

Examples of the nitrogen-containing heterocyclic compound include imidazole, azole, pyrrole, aziridine, azirine, azetidine, azete, imidazoline, and carbazole. The nitrogen-containing heterocyclic compound may be an ionized compound. Phenethylammonium may be used as the ionized compound of the nitrogen-containing heterocyclic compound.

The organic molecule represented by A in the general formula (1) is preferably an alkylamine or an alkylammonium, more preferably an alkylamine having 1 to 6 carbon atoms or an alkylammonium having 1 to 6 carbon atoms, further preferably an alkylamine having 1 to 3 carbon atoms or an alkylammonium having 1 to 3 carbon atoms, and particularly preferably methylammonium ($CH_3NH_3$).

Examples of the metal atom represented by B in the general formula (1) include lead, tin, zinc, titanium, antimony, bismuth, nickel, iron, cobalt, silver, copper, gallium, germanium, magnesium, calcium, indium, aluminum, manganese, chromium, molybdenum, and europium. For the metal atom represented by B in the general formula (1), only one metal atom may be used or two or more metal atoms may be used. To improve the light-absorbing characteristics and charge-generating characteristics of the light-absorbing layer 6, the metal atom represented by B in the general formula (1) may be a lead atom.

Examples of the halogen atom represented by X in the general formula (1) include a fluorine atom, a chlorine atom, a bromine atom, and an iodine atom. For the halogen atom represented by X in the general formula (1), only one halogen atom may be used or two or more halogen atoms may be used. An iodine atom may be used as the halogen atom represented by X in the general formula (1) to achieve a narrow energy band gap. For example, preferably, at least one halogen atom X among three halogen atoms X in the general formula (1) represents an iodine atom. More preferably, three halogen atoms X each represent an iodine atom.

The compound represented by the general formula (1) is preferably a compound represented by $CH_3NH_3PbX_3$ (X: halogen atom) and more preferably a compound represented by $CH_3NH_3PbI_3$. When the compound represented by the general formula (1) is such a compound, electrons and holes can be more efficiently generated in the light-absorbing layer 6. As a result, a photoelectric conversion element 1 having a higher photoelectric conversion efficiency can be provided.

Whether the compound (1) has a perovskite crystal structure can be confirmed by using X-ray diffractometry. Specifically, a light-absorbing layer 6 containing the compound (1) is formed on a glass plate, and the light-absorbing layer 6 is collected in the form of powder. Then, the diffraction pattern of the collected powdery light-absorbing layer 6 (compound (1)) is measured using a powder X-ray diffractometer. Alternatively, the light-absorbing layer 6 is collected from the photoelectric conversion element 1 in the form of powder, and the diffraction pattern of the collected powdery light-absorbing layer 6 (compound (1)) is measured using a powder X-ray diffractometer.

The light-absorbing layer 6 may be a layer constituted by only the compound (1). The light-absorbing layer 6 may further contain, in addition to the compound (1), a light-absorbing material other than the compound (1).

Hole Transport Layer

The hole transport layer 7 is a layer that captures holes generated in the light-absorbing layer 6 and transports the holes to a second conductive layer 8 serving as an anode. In the photoelectric conversion element 1, the hole transport layer 7 contains a hole transport material.

The melting point of the hole transport material may be 120° C. or higher and 170° C. or lower. In the case where the melting point of the hole transport material is 120° C. or higher, the melting of the hole transport material can be further suppressed during actual use of the photoelectric conversion element 1. In the case where the melting point of the hole transport material is 170° C. or lower, when the hole transport material is heated to a temperature higher than or equal to the melting point of the hole transport material in the step of melting the hole transport layer 7, the heating temperature is not excessively increased. Therefore, the deterioration of the components (more specifically, for example, the compound (1) contained in the light-absorbing layer 6) of the photoelectric conversion element 1 due to heating can be suppressed.

Examples of the hole transport material include pyrazoline compounds, arylamine compounds, stilbene compounds, enamine compounds, polypyrrole compounds, polyvinyl carbazole compounds, polysilane compounds, butadiene compounds, polysiloxane compounds having an aromatic amine on their side chain or main chain, polyaniline compounds, poly(phenylene vinylene) compounds, poly(thienylene vinylene) compounds, and polythiophene compounds. To set the heating temperature in the step of melting the hole transport layer 7 to 170° C. or lower and also improve the photoelectric conversion efficiency, the hole transport material is preferably a butadiene compound and more preferably a compound having a mono(butadiene) structure (hereafter referred to as a mono(butadiene) compound) or a compound having a bis(butadiene) structure (hereafter referred to as a bis(butadiene) compound).

The mono(butadiene) compound is preferably a compound represented by general formula (2) (hereafter referred to as a "hole transport material (2)") and more preferably a compound represented by general formula (2) and having a melting point of 120° C. or higher and 170° C. or lower.

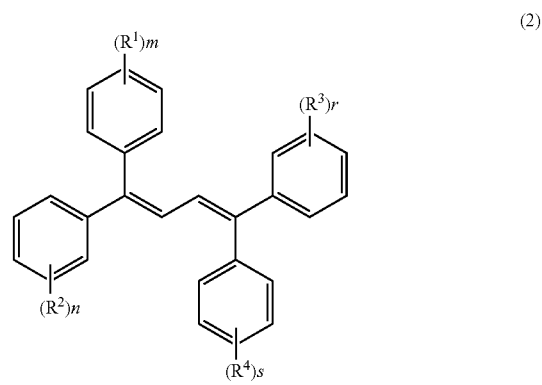

(2)

In the general formula (2), $R^1$ to $R^4$ each independently represent a substituted or unsubstituted alkyl group, a substituted or unsubstituted alkylamino group, a substituted or unsubstituted arylamino group, or a substituted or unsubstituted alkoxy group; and m, n, r, and s each independently represent an integer of 0 or more and 5 or less, excluding the case where each of m, n, r, and s represents 0. When m represents an integer of 2 or more and 5 or less, a plurality of groups $R^1$ may be the same or different. When n represents an integer of 2 or more and 5 or less, a plurality of groups $R^2$ may be the same or different. When r represents an integer of 2 or more and 5 or less, a plurality of groups $R^3$ may be the same or different. When s represents an integer of 2 or more and 5 or less, a plurality of groups $R^4$ may be the same or different.

The substituted or unsubstituted alkyl group represented by $R^1$ to $R^4$ is preferably an unsubstituted alkyl group, more preferably an unsubstituted alkyl group having 1 to 3 carbon atoms, and further preferably a methyl group or an ethyl group. The substituted alkylamino group represented by $R^1$ to $R^4$ is preferably a dibenzylamino group. The unsubstituted alkylamino group represented by $R^1$ to $R^4$ is preferably a dimethylamino group, a diethylamino group, or a dipropylamino group and more preferably a diethylamino group. The substituted or unsubstituted arylamino group represented by $R^1$ to $R^4$ is preferably an unsubstituted arylamino group and more preferably a diphenylamino group. The substituted or unsubstituted alkoxy group represented by $R^1$ to $R^4$ is preferably an unsubstituted alkoxy group, more preferably an unsubstituted alkoxy group having 1 to 3 carbon atoms, and further preferably a methoxy group.

In the general formula (2), $R^1$ to $R^4$ preferably each independently represent an unsubstituted alkylamino group, more preferably a dimethylamino group, a diethylamino group, or a dipropylamino group, and particularly preferably a diethylamino group; m and n preferably represent 1; and r and s preferably represent 1 or 0 and more preferably 0. The hole transport material (2) may be a compound represented by chemical formula (2-1) (hereafter referred to as a hole transport material (2-1)).

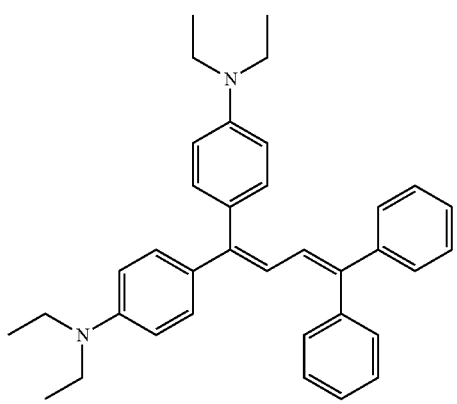

(2-1)

The bis(butadiene) compound is preferably a compound represented by general formula (3) (hereafter referred to as a hole transport material (3)) and more preferably a compound represented by general formula (3) and having a melting point of 120° C. or higher and 170° C. or lower.

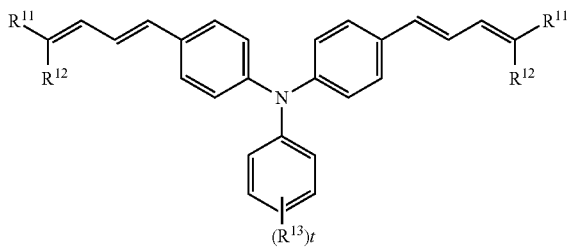

(3)

In the general formula (3), $R^{11}$ and $R^{12}$ each independently represent a hydrogen atom, a substituted or unsubstituted alkyl group, or a substituted or unsubstituted aryl group. Herein, the case where each of $R^{11}$ and $R^{12}$ represents a hydrogen atom is excluded. $R^{13}$ represents a substituted or unsubstituted alkyl group, a substituted or unsubstituted alkoxy group, a substituted or unsubstituted aryl group, or a substituted or unsubstituted aralkyl group and t represents 0 or 1.

The substituted or unsubstituted alkyl group represented by $R^{11}$, $R^{12}$, and $R^{13}$ is preferably an unsubstituted alkyl group, more preferably an unsubstituted alkyl group having 1 to 3 carbon atoms, and further preferably a methyl group or an ethyl group. The substituted or unsubstituted alkoxy group represented by $R^{13}$ is preferably an unsubstituted alkoxy group, more preferably an unsubstituted alkoxy group having 1 to 3 carbon atoms, further preferably a methoxy group or an ethoxy group, and particularly preferably a methoxy group. The unsubstituted aryl group represented by $R^{11}$, $R^{12}$, and $R^{13}$ is preferably an unsubstituted aryl group having 6 to 10 carbon atoms and more preferably a phenyl group or a naphthyl group. The substituted aryl group represented by $R^{11}$, $R^{12}$, and $R^{13}$ is preferably an aryl group having 6 to 10 carbon atoms and substituted with an alkyl group having 1 to 3 carbon atoms, more preferably a phenyl group substituted with an alkyl group having 1 to 3 carbon atoms, further preferably a tolyl group, and particularly preferably a p-tolyl group. The substituted or unsubstituted aralkyl group represented by $R^{13}$ is preferably an unsubstituted aralkyl group, more preferably an unsubstituted aralkyl group having 7 to 13 carbon atoms, and further preferably a benzyl group or a phenethyl group.

In the general formula (3), $R^{11}$ and $R^{12}$ preferably represent a substituted aryl group, more preferably an aryl group having 6 to 10 carbon atoms and substituted with an alkyl group having 1 to 3 carbon atoms, further preferably a phenyl group substituted with an alkyl group having 1 to 3 carbon atoms, further preferably a tolyl group, and particularly preferably a p-tolyl group. $R^{13}$ preferably represents an unsubstituted alkoxy group, more preferably an unsubstituted alkoxy group having 1 to 3 carbon atoms, further preferably a methoxy group or an ethoxy group, and particularly preferably a methoxy group. Furthermore, t preferably represents 1. The hole transport material (3) may be a compound represented by chemical formula (3-1) (hereafter referred to as a hole transport material (3-1)).

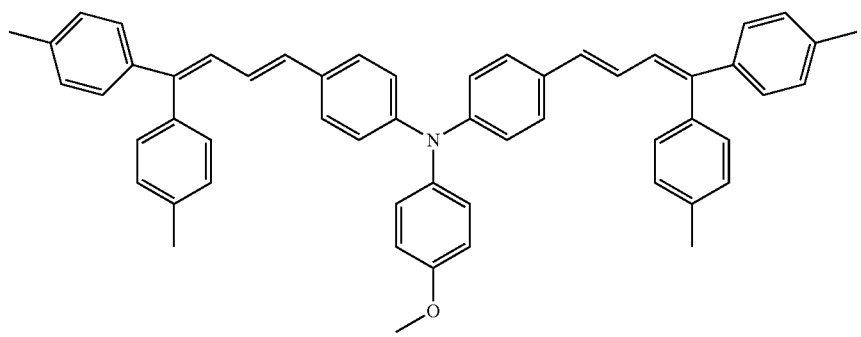

(3-1)

The hole transport layer 7 may be mainly formed of a hole transport material. Specifically, the content of the hole transport material is preferably 70 mass % or more and 100 mass % or less and more preferably 85 mass % or more and 100 mass % or less relative to the mass of the hole transport layer 7. To suppress the crystallization of the hole transport material, the hole transport layer 7 may optionally contain, for example, an organic binder resin and a plasticizer. The hole transport layer 7 may be formed of only a hole transport material.

To impart high charge transportability to the hole transport layer 7, the hole transport layer 7 may further contain a lithium compound in addition to the hole transport material. The lithium compound is contained in the hole transport layer 7 as, for example, an ionic conductive agent. The content of the lithium compound may be 5 mass % or more and 50 mass % or less relative to the mass of the hole transport material. The lithium compound may be, for example, a compound represented by general formula (4) below (hereafter referred to as a lithium compound (4)).

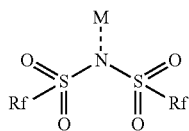

(4)

In the general formula (4), Rf each independently represent a perfluoroalkyl group. M represents lithium. The perfluoroalkyl group represented by Rf is preferably a perfluoroalkyl group having 1 to 4 carbon atoms and more preferably a trifluoromethyl group. The lithium compound (4) may be lithium bis(trifluoromethanesulfonyl)imide (chemical formula: $(CF_3SO_2)_2NLi$, hereafter may be referred to as "LiTFSI").

The thickness of the hole transport layer 7 is preferably 20 nm or more and 500 nm or less and more preferably 50 nm or more and 150 nm or less. When the hole transport layer 7 has such a thickness, holes generated in the light-absorbing layer 6 can be smoothly and efficiently moved to the second conductive layer 8. When the hole transport layer 7 is infiltrated into the pores of the porous titanium oxide layer 52 as described above, the thickness of the hole transport layer 7 is a thickness of a portion other than the portion of the hole transport layer 7 infiltrated into the pores of the porous titanium oxide layer 52.

When light L is incident from the surface layer 9 of the photoelectric conversion element 1, the hole transport layer 7 may be a transparent or semitransparent layer in order to allow the incident light L to reach the light-absorbing layer 6. To impart transparency or semitransparency to the hole transport layer 7, the hole transport layer 7 may be an amorphous layer.

Second Conductive Layer

The second conductive layer 8 corresponds to an anode of the photoelectric conversion element 1. Examples of the material for the second conductive layer 8 include metals such as gold, silver, and platinum; transparent conductive materials such as copper iodide (CuI), tin-doped indium oxide (ITO), tin oxide ($SnO_2$), fluorine-doped tin oxide (FTO), aluminum-doped zinc oxide (AZO), indium zinc oxide (IZO), and gallium-doped zinc oxide (GZO); conductive fine particles such as silver nanowires and carbon nanofibers; and conductive polymers such as polymers (PEDOT/PSS) containing poly(3,4-ethylenedioxythiophene) and polystyrenesulfonic acid. The second conductive layer 8 may contain only one of the materials or two or more of the materials.

When light L is incident from the surface layer 9 of the photoelectric conversion element 1, the second conductive layer 8 is preferably a transparent or semitransparent layer and more preferably a transparent layer in order to allow the incident light L to reach the light-absorbing layer 6. A transparent or semitransparent material can be appropriately selected from the materials exemplified as the materials for the second conductive layer 8. When light L is incident from the base 2 of the photoelectric conversion element 1, the second conductive layer 8 is not necessarily a transparent or semitransparent layer, and a metal base or a thick layer may be used as the second conductive layer 8. The thickness of the second conductive layer 8 may be 50 nm or more and 60 nm or less.

Surface Layer

The surface layer 9 is a layer that suppresses the deterioration of the inside of the photoelectric conversion element 1 due to moisture and oxygen in the air. When the surface layer 9 is disposed, the outer surface of the photoelectric conversion element 1 can be protected from impacts and scratches during actual use of the photoelectric conversion element 1. Examples of the material for the surface layer 9 include resin and glass. The surface layer 9 has, for example, a plate shape or a film shape. Examples of the surface layer 9 include glass plates, resin plates, and resin films (e.g., wrap films).

When the surface layer 9 is formed of a resin, the melting point of the resin may be higher than the melting point of the hole transport material. This is because when heating is performed to a temperature higher than or equal to the melting point of the hole transport material in the step of melting the hole transport layer 7, the deterioration of the surface layer 9 is easily suppressed. The melting point of the resin for the surface layer 9 may be 170° C. or higher. The resin for the surface layer 9 is not particularly limited as long as the resin has such high heat resistance. Examples of the resin for the surface layer 9 include polyethylene terephthalate (PET), polybutylene terephthalate (PBT), polyphenylene sulfide (PPS), polyether imide (PEI), polytetrafluoroethylene (PTFE), polyamide-imide (PAI), and silicone. The resin for the surface layer 9 may be polyethylene terephthalate (PET).

When light L is incident from the surface layer 9 of the photoelectric conversion element 1, the surface layer 9 is preferably a transparent or semitransparent layer and more preferably a transparent layer in order to allow the incident light L to reach the light-absorbing layer 6. A transparent or semitransparent material can be appropriately selected from the materials exemplified as the materials for the surface layer 9. The surface layer 9 is preferably a transparent or semitransparent glass plate, a transparent or semitransparent resin plate, or a transparent or semitransparent resin film. The surface layer 9 is more preferably a transparent or semitransparent resin film, further preferably a transparent resin film, and particularly preferably a transparent polyethylene terephthalate (PET) film. In this embodiment, the heating temperature in the step of melting the hole transport layer 7 is higher than or equal to the melting point of the hole transport material and is in the range of 120° C. or higher and 170° C. or lower. Therefore, a resin film having a relatively low softening point (e.g., a softening point of about 180° C.) can be used. By using a resin film as the surface layer 9, a large-area photoelectric conversion element 1 can be produced at low cost. Furthermore, by using a resin film as the surface layer 9, a sealing effect is produced against air and moisture. Therefore, an additional sealing material or film for sealing is not necessarily disposed on the side of the photoelectric conversion element 1 near the surface layer 9. The sealing treatment on the side of the photoelectric conversion element 1 near the surface layer 9 can be omitted, which can simplify the production process and reduce the production cost. When light L is incident from the base 2 of the photoelectric conversion element 1, the surface layer 9 is not necessarily a transparent or semitransparent layer.

EXAMPLES

Hereafter, the present disclosure will be further described based on Examples. However, the present disclosure is not limited to Examples. The methods for producing photoelectric conversion elements (A-1) to (A-8), (B-1), and (B-2), the evaluation methods, and the evaluation results will be described below.

Production Method

Production of Photoelectric Conversion Element (A-1)

First, a transparent conductive substrate A was prepared. The transparent conductive substrate A was prepared by cutting a transparent glass plate (manufactured by Sigma-Aldrich, thickness: 2.2 mm) coated with fluorine-doped tin oxide into a size of 25 mm in width and 25 mm in length. The transparent conductive substrate A was used as a base on which a first conductive layer was disposed. The transparent conductive substrate A included a transparent base and a transparent first conductive layer disposed on the base. The transparent conductive substrate A was subjected to ultrasonic cleaning in ethanol and UV cleaning.

Subsequently, the step of forming an electron transport layer was performed. Specifically, a 1-butanol solution (manufactured by Sigma-Aldrich) containing diisopropoxytitanium bis(acetylacetonate) serving as a titanium chelate compound in a concentration of 75 mass % was diluted with 1-butanol. Thus, a dense titanium oxide layer-forming coating liquid containing a titanium chelate compound in a concentration of 0.02 mol/L was prepared. The dense titanium oxide layer-forming coating liquid was applied onto the transparent conductive substrate A using a spin coater and heated at 450° C. for 15 minutes. Consequently, a dense titanium oxide layer having a thickness of 50 nm was formed on the first conductive layer. Then, a titanium oxide paste ("PST-18NR" manufactured by JGC Catalysts and Chemicals Ltd.) was diluted with ethanol to prepare a porous titanium oxide layer-forming coating liquid. The porous titanium oxide layer-forming coating liquid was applied onto the dense titanium oxide layer using a spin coater and fired at 450° C. for 1 hour. Thus, a porous titanium oxide layer having a thickness of 300 nm was formed on the dense titanium oxide layer.

Subsequently, the step of forming a light-absorbing layer was performed. Specifically, $PbI_2$ (manufactured by Tokyo Chemical Industry Co., Ltd.) and $CH_3NH_3I$ (manufactured by Tokyo Chemical Industry Co., Ltd.) were dissolved in N,N-dimethylformamide (DMF) at a molar ratio of 1:1 to prepare a light-absorbing layer-forming coating liquid having a solid content of 55 mass %. The light-absorbing layer-forming coating liquid was applied onto the porous titanium oxide layer using a spin coater and dried at 100° C. for 10 minutes. Thus, a light-absorbing layer having a thickness of 500 nm was formed on the porous titanium oxide layer. The light-absorbing layer contained $CH_3NH_3PbI_3$ having a perovskite crystal structure.

Subsequently, a transparent conductive substrate B was prepared. The transparent conductive substrate B was prepared by cutting a transparent glass plate (manufactured by Sigma-Aldrich, thickness: 2.2 mm) coated with fluorine-doped tin oxide into a size of 25 mm in width and 25 mm in length. The transparent conductive substrate B was used as a surface layer on which the second conductive layer was disposed. The transparent conductive substrate B included a transparent surface layer and a transparent second conductive layer disposed on the surface layer. The transparent conductive substrate B was subjected to ultrasonic cleaning in ethanol and UV cleaning.

Subsequently, the step of forming a hole transport layer was performed. Specifically, a toluene solution of the hole transport material (2-1) was added dropwise to the transparent conductive substrate B and dried at 100° C. for 60 minutes. The hole transport material (2-1) used was 1,1-bis (p-diethylaminophenyl)-4,4'-diphenyl-1,3-butadiene ("T-405" manufactured by Takasago International Corporation, melting point: 168° C.). Thus, a cast film (corresponding to the hole transport layer) of the hole transport material (2-1) was formed on the second conductive layer.

Subsequently, the step of melting the hole transport layer was performed. Specifically, the transparent conductive substrate B on which the hole transport layer was formed was heated to 168° C. using a hot plate to melt the hole transport material (2-1). At the same time, the transparent conductive substrate A on which the dense titanium oxide layer, the porous titanium oxide layer, and the light-absorbing layer were formed was heated to 168° C. using a hot plate.

Subsequently, the bonding step was performed. Specifically, the heated transparent conductive substrate A and the heated transparent conductive substrate B were laid on top of each other while being misaligned by 5 mm. Herein, they were laid on top of each other so that the light-absorbing layer included in the transparent conductive substrate A and the hole transport layer included in the transparent conductive substrate B faced each other. The transparent conductive substrates A and B laid on top of each other were gradually cooled to room temperature while being brought into contact with each other under pressure. Thus, the light-absorbing layer included in the transparent conductive substrate A and the hole transport layer included in the transparent conductive substrate B were bonded to each other. As a result, the light-absorbing layer and the second conductive layer were bonded to each other with the hole transport layer disposed therebetween. Terminals were attached to the first conductive layer and the second conductive layer using a silver paste. Thus, a photoelectric conversion element (A-1) was obtained. The photoelectric conversion element (A-1) included the first conductive layer, the dense titanium oxide layer, the porous titanium oxide layer, the light-absorbing layer, the hole transport layer, the second conductive layer, and the surface layer on the base in this order.

Production of photoelectric conversion element (A-2)

A photoelectric conversion element (A-2) was produced in the same manner as the photoelectric conversion element (A-1), except that the step of forming a hole transport layer was changed as follows. In the step of forming a hole transport layer of the photoelectric conversion element (A-2), a toluene solution of the hole transport material (2-1) was added dropwise to the transparent conductive substrate B and dried at 100° C. for 60 minutes. Thus, a cast film of the hole transport material (2-1) was formed on the second conductive layer. An ethanol solution of LiTFSI (manufactured by KISHIDA CHEMICAL Co., Ltd.) serving as a lithium compound was added dropwise to the cast film of the hole transport material (2-1) and dried at 100° C. for 60 minutes. The amount of the lithium compound added was 32 mass % relative to the mass of the hole transport material (2-1). Thus, a cast film (corresponding to the hole transport layer) containing the hole transport material (2-1) and LiTFSI in a mixed manner was formed on the second conductive layer.

Production of Photoelectric Conversion Element (A-3)

A photoelectric conversion element (A-3) was produced in the same manner as the photoelectric conversion element (A-1), except that the hole transport material (2-1) was changed to a hole transport material (3-1) and the heating temperature in the melting step was changed to 168° C. to 130° C. The melting point of the hole transport material (3-1) was 123° C.

Production of Photoelectric Conversion Element (A-4)

A photoelectric conversion element (A-4) was produced in the same manner as the photoelectric conversion element (A-3), except that the step of forming a hole transport layer was changed as follows. In the step of forming a hole transport layer of the photoelectric conversion element (A-4), a toluene solution of the hole transport material (3-1) was added dropwise to the transparent conductive substrate B and dried at 100° C. for 60 minutes. Thus, a cast film of the hole transport material (3-1) was formed on the second conductive layer. An ethanol solution of LiTFSI (manufactured by KISHIDA CHEMICAL Co., Ltd.) serving as an ionic conductive agent was added dropwise to the cast film of the hole transport material (3-1) and dried at 100° C. for 60 minutes. The amount of the lithium compound added was 21 mass % relative to the mass of the hole transport material (3-1). Thus, a cast film (corresponding to the hole transport layer) containing the hole transport material (3-1) and LiTFSI in a mixed manner was formed on the second conductive layer.

Production of Photoelectric Conversion Element (A-5)

A photoelectric conversion element (A-5) was produced in the same manner as the photoelectric conversion element (A-3), except that the transparent conductive substrate B was changed to a film C. The film C was prepared by cutting a sheet-shaped polyethylene terephthalate film (ITO-coated PET film sheet, manufactured by Sigma-Aldrich) coated with tin-doped indium oxide into a size of 25 mm in width and 25 mm in length. The film C was used as a surface layer on which the second conductive layer was disposed. The film C included a surface layer that was a transparent resin film and a transparent second conductive layer disposed on the surface layer.

Production of Photoelectric Conversion Element (B-1)

A photoelectric conversion element (B-1) was produced in the same manner as the photoelectric conversion element (A-1), except that the step of forming a hole transport layer and the step of melting the hole transport layer were changed as follows.

In the step of forming a hole transport layer of the photoelectric conversion element (B-1), a compound (manufactured by Luminescence Technology, melting point: 243° C. to 248° C.) represented by formula below was used as a hole transport material. Hereafter, the compound represented by the formula below is referred to as a "hole transport material (spiro-OMeTAD)".

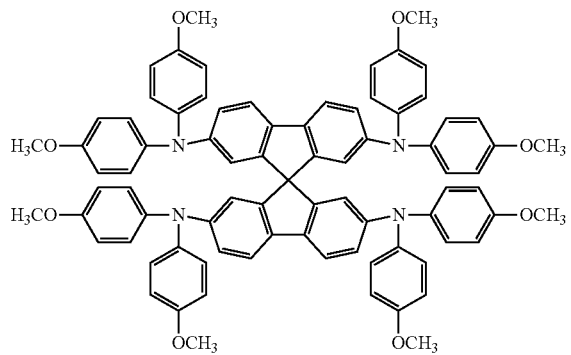

A hole transport layer-forming coating liquid was prepared by dissolving 144 mg of the hole transport material (spiro-OMeTAD), 18 mg of LiTFSI (manufactured by KISHIDA CHEMICAL Co., Ltd.) serving as a lithium compound, and 53 mg of 4-tert-butylpyridine (manufactured by Tokyo Chemical Industry Co., Ltd.) in 2 mL of chlorobenzene (manufactured by KISHIDA CHEMICAL Co., Ltd.). To oxidize the hole transport material (spiro-OMeTAD), the hole transport layer-forming coating liquid was left to stand in the air for one day. After that, the hole transport layer-forming coating liquid was added dropwise to the transparent conductive substrate B and dried at 100° C. for 60 minutes. Thus, a cast film (corresponding to the hole transport layer) of the hole transport material (spiro-OMeTAD) was formed on the second conductive layer.

In the step of melting the hole transport layer of the photoelectric conversion element (B-1), the transparent conductive substrate B on which the hole transport layer was formed was heated to 250° C. using a hot plate to melt the hole transport material (spiro-OMeTAD). At the same time, the transparent conductive substrate A on which the dense titanium oxide layer, the porous titanium oxide layer, and the light-absorbing layer were formed was heated to 250° C. using a hot plate. As a result of the heating, a change in color from black to yellow was observed in the light-absorbing layer.

Production of Photoelectric Conversion Element (B-2)

A photoelectric conversion element (B-2) was produced in the same manner as the photoelectric conversion element (A-1), except that the step of forming a hole transport layer and the step of melting the hole transport layer were not performed and the bonding step was changed as follows. The reason for the changes was to avoid excessive heating of the light-absorbing layer because the change in color of the light-absorbing layer was observed in the production of the photoelectric conversion element (B-1).

In the bonding step of the photoelectric conversion element (B-2), a hole transport layer-forming coating liquid was prepared by dissolving 144 mg of the hole transport material (spiro-OMeTAD), 18 mg of LiTFSI (manufactured by KISHIDA CHEMICAL Co., Ltd.) serving as a lithium compound, and 53 mg of 4-tert-butylpyridine (manufactured by Tokyo Chemical Industry Co., Ltd.) in 2 mL of chlorobenzene (manufactured by KISHIDA CHEMICAL Co., Ltd.). To oxidize the hole transport material (spiro-OMeTAD), the hole transport layer-forming coating liquid was left to stand in the air for one day. After that, the hole transport layer-forming coating liquid was added dropwise to the transparent conductive substrate B. In the state of a solution (coating liquid) without drying the hole transport layer-forming coating liquid, the transparent conductive substrate A and the transparent conductive substrate B were laid on top of each other while being misaligned by 5 mm. Herein, they were laid on top of each other so that the light-absorbing layer included in the transparent conductive substrate A and the layer of the hole transport layer-forming coating liquid included in the transparent conductive substrate B faced each other. The transparent conductive substrates A and B laid on top of each other were heated to 131° C. using a hot plate while being brought into contact with each other under pressure. The temperature 131° C. is a boiling point of chlorobenzene contained in the coating liquid. As a result of the heating, air bubbles of vaporized chlorobenzene were generated and thus a hole transport layer could not be produced. The light-absorbing layer and the second conductive layer could not be bonded to each other with the hole transport layer disposed therebetween.

Production of Photoelectric Conversion Element (A-6)

An aluminum plate (182 mm in length, 257 mm in width, 1 mm in thickness) was used as a first conductive layer that also serves as a base. The aluminum plate was subjected to ultrasonic cleaning in ethanol and UV cleaning.

Subsequently, the step of forming an electron transport layer was performed. Specifically, a 1-butanol solution (manufactured by Sigma-Aldrich) containing diisopropoxytitanium bis(acetylacetonate) serving as a titanium chelate compound in a concentration of 75 mass % was diluted with 1-butanol. Thus, a dense titanium oxide layer-forming coating liquid containing a titanium chelate compound in a concentration of 0.02 mol/L was prepared. The dense titanium oxide layer-forming coating liquid was applied onto the aluminum plate using an applicator having a coating width of 100 mm and heated at 450° C. for 15 minutes. Thus, a dense titanium oxide layer having a thickness of 50 nm was formed on the first conductive layer that also serves as a base. Then, a titanium oxide paste ("PST-18NR" manufactured by JGC Catalysts and Chemicals Ltd.) was diluted with ethanol to prepare a porous titanium oxide layer-forming coating liquid. The porous titanium oxide layer-forming coating liquid was applied onto the dense titanium oxide layer using an applicator having a coating width of 100 mm and fired at 450° C. for 1 hour. Thus, a porous titanium oxide layer having a thickness of 300 nm was formed on the dense titanium oxide layer.

Subsequently, the step of forming a light-absorbing layer was performed. Specifically, $PbI_2$ (manufactured by Tokyo Chemical Industry Co., Ltd.) and $CH_3NH_3I$ (manufactured by Tokyo Chemical Industry Co., Ltd.) were dissolved in N,N-dimethylformamide (DMF) at a molar ratio of 1:1 to prepare a light-absorbing layer-forming coating liquid having a solid content of 55 mass %. The light-absorbing layer-forming coating liquid was applied onto the porous titanium oxide layer using an applicator having a coating width of 100 mm and dried at 100° C. for 10 minutes. Thus, a light-absorbing layer having a thickness of 500 nm was formed on the porous titanium oxide layer. The light-absorbing layer contained $CH_3NH_3PbI_3$ having a perovskite crystal structure.

Subsequently, a film D was prepared. The film D was prepared by cutting a sheet-shaped polyethylene terephthalate film (ITO-coated PET film sheet, manufactured by Sigma-Aldrich) coated with tin-doped indium oxide into a size of 182 mm in length and 257 mm in width. The film D was used as a surface layer on which the second conductive layer was disposed. The film D included a surface layer that was a transparent resin film and a transparent second conductive layer disposed on the surface layer. The film D was subjected to ultrasonic cleaning in ethanol and UV cleaning.

Subsequently, the step of forming a hole transport layer was performed. Specifically, a toluene solution of the hole transport material (2-1) was applied onto the film D using an applicator having a coating width of 100 mm and dried at 100° C. for 30 minutes. Thus, a cast film (corresponding to the hole transport layer) of the hole transport material (2-1) was formed on the second conductive layer. Then, the film D on which the hole transport layer was formed and the aluminum plate on which the dense titanium oxide layer, the porous titanium oxide layer, and the light-absorbing layer were formed were each cut into a size of 80 mm in width and 80 mm in length.

Subsequently, the step of melting the hole transport layer was performed. Specifically, the cut film D on which the hole transport layer was formed was heated to 168° C. using a hot plate to melt the hole transport material (2-1). At the same time, the cut aluminum plate on which the dense titanium oxide layer, the porous titanium oxide layer, and the light-absorbing layer were formed was heated to 168° C. using a hot plate.

Subsequently, the bonding step was performed. Specifically, the heated film D and the heated aluminum plate were laid on top of each other while being misaligned by 5 mm. Herein, they were laid on top of each other so that the light-absorbing layer included in the aluminum plate and the hole transport layer included in the film D faced each other. The aluminum plate and the film D laid on top of each other were gradually cooled to room temperature while being brought into contact with each other under pressure. Thus, the light-absorbing layer included in the aluminum plate and the hole transport layer included in the film D were bonded to each other. As a result, the light-absorbing layer and the film D (the second conductive layer disposed on the surface layer) were bonded to each other with the hole transport layer disposed therebetween. Terminals were attached to the first conductive layer and the second conductive layer using a silver paste. Thus, a photoelectric conversion element (A-6) was obtained. The photoelectric conversion element (A-6) included the dense titanium oxide layer, the porous titanium oxide layer, the light-absorbing layer, the hole transport layer, the second conductive layer, and the surface layer on the first conductive layer that also serves as a base in this order.

Production of Photoelectric Conversion Element (A-7)

A photoelectric conversion element (A-7) was produced in the same manner as the photoelectric conversion element (A-1), except that the step of forming a light-absorbing layer was changed as follows. In the step of forming a light-absorbing layer of the photoelectric conversion element (A-7), $PbI_2$ (manufactured by Tokyo Chemical Industry Co., Ltd.) was dissolved in N,N-dimethylformamide (DMF) while being heated to 70° C. Thus, a light-absorbing layer-forming coating liquid was prepared. The transparent conductive substrate A on which the dense titanium oxide layer and the porous titanium oxide layer were formed was heated to 70° C. After that, the light-absorbing layer-forming coating liquid was applied onto the porous titanium oxide layer using a spin coater and dried at 70° C. for 60 minutes. Thus, a coating film was formed on the porous titanium oxide layer. Then, $CH_3NH_3I$ (manufactured by Tokyo Chemical Industry Co., Ltd.) was dissolved in isopropyl alcohol to prepare a light-absorbing layer-forming solution. The transparent conductive substrate A on which the coating film was formed was immersed in the light-absorbing layer-forming solution. A change in color from white to black was observed in the coating film. The transparent conductive substrate A was taken out of the light-absorbing layer-forming solution and dried at 70° C. for 30 minutes. Thus, a light-absorbing layer having a thickness of 200 nm was formed on the porous titanium oxide layer. The light-absorbing layer contained $CH_3NH_3PbI_3$ having a perovskite crystal structure.

Production of Photoelectric Conversion Element (A-8)

An aluminum cylindrical body (outer diameter: 30 mm, length in axial direction: 340 mm, thickness: 1 mm) was used as a first conductive layer that also serves as a base. The aluminum cylindrical body was subjected to ultrasonic cleaning in ethanol and UV cleaning.

Subsequently, the step of forming an electron transport layer was performed. Specifically, a 1-butanol solution (manufactured by Sigma-Aldrich) containing diisopropoxytitanium bis(acetylacetonate) serving as a titanium chelate compound in a concentration of 75 mass % was diluted with 1-butanol. Thus, a dense titanium oxide layer-forming coating liquid containing a titanium chelate compound in a concentration of 0.02 mol/L was prepared. The aluminum cylindrical body was immersed in the dense titanium oxide layer-forming coating liquid and then heated at 450° C. for 15 minutes. Thus, a dense titanium oxide layer having a thickness of 50 nm was formed on the first conductive layer. Then, 43 parts by mass of titanium oxide ("AEROXIDE (registered trademark) $TiO_2$ P25" manufactured by NIPPON AEROSIL Co., Ltd.), 21 parts by mass of α-terpineol, 2 parts by mass of ethyl cellulose, 1 part by mass of 2-(2-n-butoxyethoxy)ethanol, and 33 parts by mass of ethanol were mixed with each other using a paint shaker to prepare a porous titanium oxide layer-forming coating liquid. The aluminum cylindrical body on which the dense titanium oxide layer was formed was immersed in the porous titanium oxide layer-forming coating liquid and then fired at 450° C. for 1 hour. Thus, a porous titanium oxide layer having a thickness of 300 nm was formed on the dense titanium oxide layer.

Subsequently, the step of forming a light-absorbing layer was performed. Specifically, $PbI_2$ (manufactured by Tokyo Chemical Industry Co., Ltd.) was dissolved in N,N-dimethylformamide (DMF) while being heated to 70° C. to prepare a light-absorbing layer-forming coating liquid. The aluminum cylindrical body on which the dense titanium oxide layer and the porous titanium oxide layer were formed was immersed in the light-absorbing layer-forming coating liquid while the temperature was kept at 70° C. to form a coating film on the porous titanium oxide layer. The aluminum cylindrical body on which the coating film was formed was cooled and left to stand at normal temperature. The coating film of $PbI_2$ had a yellow color, which was the same as the color of the light-absorbing layer-forming coating liquid. Then, $CH_3NH_3I$ (manufactured by Wako Pure Chemical Industries, Ltd.) was dissolved in isopropyl alcohol. Thus, a light-absorbing layer-forming solution was prepared. The aluminum cylindrical body on which the coating film of $PbI_2$ was formed was immersed in the light-absorbing layer-forming solution to apply the light-absorbing layer-forming solution onto the coating film of $PbI_2$. Herein, the aluminum cylindrical body was immersed at an immersion rate of 10 mm/sec, caused to stand still for 1 second at the deepest point, and pulled up at a pulling rate of 2 mm/sec. A change in color from yellow to black was observed in the coating film. The aluminum cylindrical body was dried at 70° C. for 60 minutes. Thus, a light-absorbing layer having a thickness of 200 nm was formed on the porous titanium oxide layer. The light-absorbing layer contained $CH_3NH_3PbI_3$ having a perovskite crystal structure.

Subsequently, the step of forming a hole transport layer was performed. Specifically, the aluminum cylindrical body on which the light-absorbing layer was formed was immersed in a toluene solution of the hole transport material (2-1) and then dried at 70° C. for 30 minutes. Thus, a cast film (corresponding to the hole transport layer) of the hole transport material (2-1) was formed on the light-absorbing layer.

Subsequently, a film E was prepared. The film E was prepared by cutting a sheet-shaped polyethylene terephthalate film (ITO-coated PET film sheet, manufactured by Sigma-Aldrich) coated with tin-doped indium oxide into a size of 95 mm in width and 340 mm in length. The film E was used as a surface layer on which the second conductive layer was disposed. The film E included a surface layer that was a transparent resin film and a transparent second conductive layer disposed on the surface layer. The film E was subjected to ultrasonic cleaning in ethanol and UV cleaning.

Subsequently, the step of melting the hole transport layer was performed. Specifically, the aluminum cylindrical body on which the hole transport layer was formed was heated to 170° C. using a clean oven to melt the hole transport material (2-1). At the same time, the film E was heated to 170° C. using the same clean oven.

Subsequently, the bonding step was performed. Specifically, the heated film E was wrapped around the heated aluminum cylindrical body and they were brought into contact with each other under pressure. Herein, the wrapping was performed so that the second conductive layer of the film E and the hole transport layer included in the aluminum cylindrical body faced each other. Since the hole transport material had a high viscosity, the hole transport layer did not drip from the aluminum cylindrical body. The temperature was gradually decreased to room temperature while the film E and the aluminum cylindrical body were brought into contact with each other under pressure. Thus, the second conductive layer of the film E and the hole transport layer were bonded to each other. As a result, the light-absorbing layer and the second conductive layer were bonded to each other with the hole transport layer disposed therebetween. Lead wires were attached to the end portion of the aluminum cylindrical body and the end portion of the second conductive layer of the film E. Thus, a photoelectric conversion element (A-8) was obtained. The photoelectric conversion element (A-8) included the dense titanium oxide layer, the porous titanium oxide layer, the light-absorbing layer, the hole transport layer, the second conductive layer, and the surface layer on the first conductive layer that also serves as a base in this order.

Evaluation Method and Evaluation Result

The short-circuit current, the open-circuit voltage, the fill factor, and the photoelectric conversion efficiency of each of the produced photoelectric conversion elements (A-1) to (A-8), (B-1), and (B-2) were measured with a solar simulator (manufactured by WACOM ELECTRIC Co., Ltd.). The photoelectric conversion element was connected to the solar simulator so that the second conductive layer of the photoelectric conversion element on the surface layer side served as an anode and the first conductive layer of the photoelectric conversion element on the base side served as a cathode. The photoelectric conversion element was irradiated with 100 mW/cm$^2$ simulated sunlight obtained by passing light from a xenon lamp through an air mass filter ("AM-1.5" manufactured by NIKON Corporation). The current-voltage characteristics of the photoelectric conversion element irradiated were measured to obtain a current-voltage curve. The short-circuit current, the open-circuit voltage, the fill factor, and the photoelectric conversion efficiency were calculated from the current-voltage curve. Table 1 shows the results.

In Table 1, "HTM" represents a hole transport material; "Mp" represents the melting point of the hole transport material; "2-1" represents a hole transport material (2-1) (1,1-bis(p-diethylaminophenyl)-4,4'-diphenyl-1,3-butadiene, "T-405" manufactured by Takasago International Corporation, melting point: 168° C.); "3-1" represents a hole transport material (3-1) (N,N-bis[4-[4,4-bis(4-methylphenyl)-1,3-butadienyl]phenyl]-4-methoxyphenylamine, melting point: 123° C.); "spiro-OMeTAD" represents a hole transport material (spiro-OMeTAD) (melting point: 243° C. to 248° C.); "Heating temperature" represents a temperature to which the hole transport layer was heated in the melting step; and "Conversion efficiency" represents a photoelectric conversion efficiency.

disclosure exhibited a higher photoelectric conversion efficiency than the photoelectric conversion elements (B-1) and (B-2). The photoelectric conversion elements (A-1) to (A-8)

TABLE 1

| | Photoelectric conversion element | Hole transport layer | | | Short-circuit current Jsc [mA/cm$^2$] | Open-circuit voltage Voc [V] | Fill factor FF [%] | Conversion efficiency η [%] |
|---|---|---|---|---|---|---|---|---|
| | | HTM Type | Mp [° C.] | Heating temperature [° C.] | | | | |
| Example 1 | A-1 | 2-1 | 168 | 168 | 12.3 | 0.82 | 0.64 | 6.5 |
| Example 2 | A-2 | 2-1 | 168 | 168 | 13.1 | 0.87 | 0.68 | 7.7 |
| Example 3 | A-3 | 3-1 | 123 | 130 | 10.2 | 0.73 | 0.55 | 4.1 |
| Example 4 | A-4 | 3-1 | 123 | 130 | 10.8 | 0.77 | 0.57 | 4.7 |
| Example 5 | A-5 | 3-1 | 123 | 130 | 10.3 | 0.79 | 0.63 | 5.1 |
| Example 6 | A-6 | 2-1 | 168 | 168 | 11.8 | 0.81 | 0.62 | 5.9 |
| Example 7 | A-7 | 2-1 | 168 | 168 | 11.8 | 0.80 | 0.61 | 5.8 |
| Example 8 | A-8 | 2-1 | 168 | 170 | 12.1 | 0.82 | 0.65 | 6.4 |
| Comparative Example 1 | B-1 | spiro-OMeTAD | 243-248 | 250 | 0.01 | 0.05 | 0.02 | 0.0 |
| Comparative Example 2 | B-2 | spiro-OMeTAD | 243-248 | 131 | unmeasurable | unmeasurable | unmeasurable | unmeasurable |

Each of the methods for producing photoelectric conversion elements (A-1) to (A-8) included the step of forming a hole transport layer, the step of melting the hole transport layer, and the bonding step. In the step of melting the hole transport layer, the hole transport layer was heated to a temperature that is higher than or equal to the melting point of the hole transport material and is in the range of 120° C. or higher and 170° C. or lower to melt the hole transport layer. The light-absorbing layer contained the compound (1) (specifically, $CH_3NH_3PbI_3$ having a perovskite crystal structure). Therefore, as shown in Table 1, the short-circuit current, the open-circuit voltage, and the fill factor of the photoelectric conversion elements (A-1) to (A-8) were larger than those of the photoelectric conversion element (B-1). Furthermore, the photoelectric conversion efficiency of the photoelectric conversion elements (A-1) to (A-8) was higher than that of the photoelectric conversion element (B-1).

In the step of melting the hole transport layer of the photoelectric conversion element (B-1), the temperature to which the hole transport layer was heated was not a temperature of 120° C. or higher and 17° C. or lower. Therefore, as shown in Table 1, the short-circuit current, the open-circuit voltage, and the fill factor of the photoelectric conversion element (B-1) were small and the photoelectric conversion efficiency was low. This may be because the compound (1) (specifically, $CH_3NH_3PbI_3$ having a perovskite crystal structure) was deteriorated as a result of the heating.

The method for producing a photoelectric conversion element (B-2) did not include the step of forming a hole transport layer or the step of melting the hole transport layer. Furthermore, the temperature to which the hole transport layer was heated was lower than the melting point of the hole transport material. Therefore, a large number of air bubbles of the residual solvent were generated during the production of the photoelectric conversion element (B-2). Consequently, as shown in Table 1, the short-circuit current, the open-circuit voltage, the fill factor, and the photoelectric conversion efficiency of the photoelectric conversion element (B-2) were unmeasurable.

As is clear from the above results, the photoelectric conversion elements (A-1) to (A-8) produced by the production method according to an embodiment of the present could be produced by a simple method without performing sealing treatment or vapor deposition treatment.

The photoelectric conversion element produced by the production method according to an embodiment of the present disclosure can be used for, for example, solar photovoltaic power generation systems such as mega-solar systems, solar cells, and power supplies for small mobile devices.

The present disclosure contains subject matter related to that disclosed in Japanese Priority Patent Application JP 2018-090671 filed in the Japan Patent Office on May 9, 2018, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method for producing a photoelectric conversion element, comprising:
    forming a hole transport layer containing a hole transport material by causing the hole transport material to adhere to one of a light-absorbing layer and a conductive layer;
    melting the hole transport layer by heating the hole transport layer to a temperature that is higher than or equal to a melting point of the hole transport material and is in a range of 120° C. or higher and 170° C. or lower; and
    bonding the light-absorbing layer and the conductive layer with the hole transport layer disposed therebetween by performing cooling while bringing the other of the light-absorbing layer and the conductive layer into contact with the melted hole transport layer under pressure,
    wherein the light-absorbing layer contains a compound represented by general formula (1), $$ABX_3 \tag{1}$$

wherein A represents an organic molecule, B represents a metal atom, and X represents a halogen atom.

2. The method for producing a photoelectric conversion element according to claim 1, wherein before the other of the light-absorbing layer and the conductive layer is brought into contact with the hole transport layer under pressure, the other of the light-absorbing layer and the conductive layer is heated to a temperature that is higher than or equal to the melting point of the hole transport material and is in a range of 120° C. or higher and 170° C. or lower.

3. The method for producing a photoelectric conversion element according to claim 1, wherein in the general formula (1), A represents an alkylamine or an alkylammonium, B represents a lead atom, and X represents a fluorine atom, a chlorine atom, a bromine atom, or an iodine atom.

4. The method for producing a photoelectric conversion element according to claim 1, wherein the compound represented by the general formula (1) has a perovskite crystal structure.

5. The method for producing a photoelectric conversion element according to claim 1, wherein the hole transport material contains a compound having a mono(butadiene) structure or a compound having a bis(butadiene) structure.

6. The method for producing a photoelectric conversion element according to claim 1, wherein the hole transport material contains a compound represented by general formula (2),

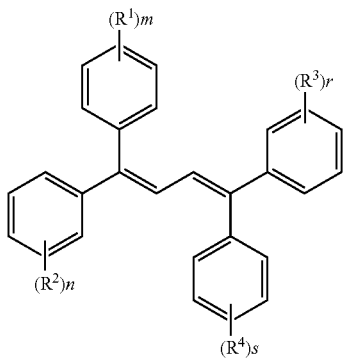

(2)

wherein $R^1$ to $R^4$ each independently represent a substituted or unsubstituted alkyl group, a substituted or unsubstituted alkylamino group, a substituted or unsubstituted arylamino group, or a substituted or unsubstituted alkoxy group, m, n, r, and s each independently represent an integer of 0 or more and 5 or less, excluding a case where each of m, n, r, and s represents 0, when m represents an integer of 2 or more and 5 or less, a plurality of groups $R^1$ may be the same or different, when n represents an integer of 2 or more and 5 or less, a plurality of groups $R^2$ may be the same or different, when r represents an integer of 2 or more and 5 or less, a plurality of groups $R^3$ may be the same or different, and when s represents an integer of 2 or more and 5 or less, a plurality of groups $R^4$ may be the same or different.

7. The method for producing a photoelectric conversion element according to claim 1, wherein the hole transport material contains a compound represented by general formula (3),

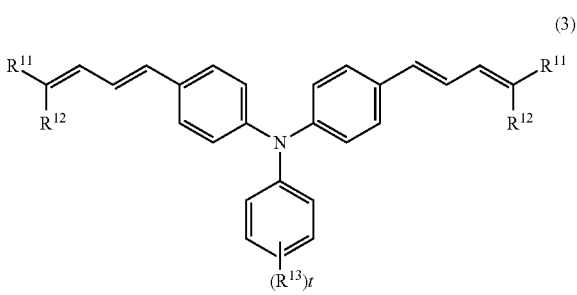

(3)

wherein $R^{11}$ and $R^{12}$ each independently represent a hydrogen atom, a substituted or unsubstituted alkyl group, or a substituted or unsubstituted aryl group, excluding a case where each of $R^{11}$ and $R^{12}$ represents a hydrogen atom, $R^{13}$ represents a substituted or unsubstituted alkyl group, a substituted or unsubstituted alkoxy group, a substituted or unsubstituted aryl group, or a substituted or unsubstituted aralkyl group, and t represents 0 or 1.

8. The method for producing a photoelectric conversion element according to claim 1, wherein the hole transport layer further contains a lithium compound.

9. The method for producing a photoelectric conversion element according to claim 1, wherein a surface layer is disposed on a first surface of the conductive layer, the first surface being a surface opposite to a second surface of the conductive layer that is bonded to the hole transport layer, and the conductive layer is transparent or semitransparent and the surface layer is a transparent or semitransparent resin film.

* * * * *